(12) United States Patent
Shirasaki

(10) Patent No.: US 10,634,991 B2
(45) Date of Patent: Apr. 28, 2020

(54) CONTAINER FOR STORING A PELLICLE FOR LITHOGRAPHY

(71) Applicant: SHIN-ETSU CHEMICAL CO., LTD., Tokyo (JP)

(72) Inventor: Toru Shirasaki, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/969,226

(22) Filed: Dec. 15, 2015

(65) Prior Publication Data
US 2016/0178998 A1    Jun. 23, 2016

(30) Foreign Application Priority Data

Dec. 18, 2014 (JP) ................. 2014-255838

(51) Int. Cl.
| H01L 21/673 | (2006.01) |
| G03F 7/20 | (2006.01) |
| G03F 1/66 | (2012.01) |
| G03F 1/62 | (2012.01) |

(52) U.S. Cl.
CPC .............. *G03F 1/62* (2013.01); *G03F 1/66* (2013.01); *G03F 7/70916* (2013.01); *G03F 7/70983* (2013.01); *H01L 21/67359* (2013.01); *H01L 21/67366* (2013.01)

(58) Field of Classification Search
CPC ..... G03F 1/62; G03F 1/64; G03F 1/66; G03F 7/70916; G03F 7/70983; H01L 21/67366; H01L 21/67359
USPC ....... 206/454, 449, 455, 701, 710, 724, 557; 430/5; 359/629; 428/14
See application file for complete search history.

(56) References Cited

U.S. PATENT DOCUMENTS

| 4,511,038 A * | 4/1985 | Miller | B65D 85/48 206/454 |
| 5,344,677 A * | 9/1994 | Hong | G03F 1/62 359/350 |
| 5,353,934 A * | 10/1994 | Yamauchi | G03F 1/66 206/453 |

(Continued)

FOREIGN PATENT DOCUMENTS

| CN | 104111582 A | 10/2014 |
| JP | 8-62828 A | 3/1996 |

(Continued)

OTHER PUBLICATIONS

Office Action dated Oct. 24, 2016, issued in counterpart Taiwanese Patent Application No. 104141613. (4 pages).

(Continued)

*Primary Examiner* — Jacob K Ackun
*Assistant Examiner* — Jenine Pagan
(74) *Attorney, Agent, or Firm* — Westerman, Hattori, Daniels & Adrian, LLP

(57) ABSTRACT

There is provided a pellicle container for storing a pellicle used in lithography, having a tray and a cover between which the pellicle is stored, and the tray has a pellicle mount section on which the pellicle is used to be mounted, but the tray of this container further has a plane plate, preferably a quartz plane plate, having a flatness of 10 micrometers or smaller provided on top of the pellicle mount so as to stabilize the flatness of the pellicle, especially its agglutinant layer.

1 Claim, 5 Drawing Sheets

(56) References Cited

U.S. PATENT DOCUMENTS

| | | | | |
|---|---|---|---|---|
| 5,577,610 A * | 11/1996 | Okuda | G03F 1/62 | 206/454 |
| 5,820,950 A * | 10/1998 | Wang | G03F 1/62 | 428/14 |
| 6,264,773 B1 * | 7/2001 | Cerio | G03F 1/64 | 156/152 |
| 6,406,573 B1 * | 6/2002 | Cerio | G03F 1/64 | 156/152 |
| 6,744,562 B2 * | 6/2004 | Okada | G03F 1/64 | 355/53 |
| 7,072,438 B2 * | 7/2006 | Chiba | B82Y 10/00 | 378/34 |
| 8,159,654 B2 * | 4/2012 | Matsushita | G03F 1/62 | 355/30 |
| 8,613,359 B2 * | 12/2013 | Kolbow | G03F 1/66 | 206/710 |
| 8,685,598 B2 * | 4/2014 | Murakami | C08L 23/10 | 430/5 |
| 8,883,373 B2 * | 11/2014 | Mimotogi | G03F 1/62 | 430/5 |
| 8,888,086 B2 * | 11/2014 | Rastegar | G03F 1/66 | 206/710 |
| 8,945,799 B2 * | 2/2015 | Taneichi | G03F 1/62 | 430/5 |
| 2001/0004508 A1 * | 6/2001 | Shirasaki | G03F 1/64 | 430/5 |
| 2001/0035361 A1 * | 11/2001 | Mishiro | B65D 25/107 | 206/316.1 |
| 2004/0123950 A1 * | 7/2004 | Boyd | G03F 1/64 | 430/5 |
| 2004/0194556 A1 * | 10/2004 | Shu | G01L 1/22 | 73/862.045 |
| 2005/0208427 A1 * | 9/2005 | Hayano | G03F 1/30 | 430/311 |
| 2006/0213797 A1 * | 9/2006 | Nozaki | G03F 1/64 | 206/455 |
| 2009/0246644 A1 * | 10/2009 | Chakravorty | G03F 1/64 | 430/5 |
| 2012/0107548 A1 * | 5/2012 | Sekihara | G03F 1/62 | 428/76 |
| 2013/0101927 A1 * | 4/2013 | Taneichi | G03F 1/62 | 430/5 |
| 2014/0170535 A1 * | 6/2014 | Yano | C09J 133/08 | 430/5 |
| 2014/0315122 A1 * | 10/2014 | Sekihara | G03F 1/22 | 430/5 |

FOREIGN PATENT DOCUMENTS

| | | |
|---|---|---|
| JP | 2012-108277 A | 6/2012 |
| TW | I391304 B | 4/2013 |
| TW | 201346435 A | 11/2013 |
| WO | 2007/038504 A2 | 4/2007 |

OTHER PUBLICATIONS

Office Action dated Aug. 31, 2017, issued in counterpart Japanese Application No. 2014-255838, with English translation (6 pages).

* cited by examiner

CONTAINER FOR STORING A PELLICLE FOR LITHOGRAPHY

The present non-provisional patent application claims priority, as per Paris Convention, from Japanese Patent Application No. 2014-255838 filed on Dec. 18, 2014, the disclosure of which is hereby incorporated by reference herein in its entirety.

FIELD OF THE INVENTION

The present invention relates to a container to store a pellicle for lithography, which pellicle is used as a dust fender for a mask for lithography employed in the scenes of manufacturing semiconductor devices such as LSI and Super-LSI, and liquid crystal display panels, etc.

BACKGROUND TECHNOLOGY

In manufacturing semiconductor devices such as LSI and super-LSI or in manufacturing a liquid crystal display board, a pattern is made by irradiating a light to a semiconductor wafer or an original plate for liquid crystal; however, if a dust adheres to a mask for lithography (also simply referred to as "mask") or a reticle (these are collectively referred to as "exposure original plate" herein below), the dust absorbs light or bends it, causing deformation of a transferred pattern, roughened edges or black stains on a base, and leads to problems of damaged dimensions, poor quality, deformed appearance and the like.

The above-mentioned manufacturing of semiconductor devices and liquid crystal display board are usually performed in a clean room, but even so, it is still difficult to keep the exposure original plate clean all the time; therefore, in general the light irradiation is carried out only after a surface of the exposure original plate is sheltered by a pellicle. In this way, the dust particle is prevented from directly adhering to the surface of the exposure original plate but is caught on the pellicle, and if, at the time of the lithography, the exposure light is focused on the pattern described on the exposure original plate the dust particle on the pellicle fails to affect the image transferring.

As shown in FIG. 1 as well as FIG. 3, a pellicle is basically built up of a pellicle frame 3, a transparent pellicle membrane 2, which is attached tensely to an upper annular face of the pellicle frame 3, and an agglutinant layer 4 formed on a lower annular face of the pellicle frame 3 for enabling the pellicle to be adhered to a mask or an exposure original plate.

The pellicle membrane 2 is made of cellulose nitrate, cellulose acetate and a fluorine-containing polymer or the like which transmit well such lights of mercury lamp that are used in light exposure (e.g., g-line [436 nm], i-line [365 nm], KrF excimer laser [248 nm], and ArF excimer laser [193 nm]). To attach the pellicle membrane 2 to the pellicle frame 3, a solvent that dissolves the pellicle membrane well is applied to the upper annular face of the frame 3 and, after pasting the pellicle membrane 2 on it, the solvent and the membrane are dried by air flow, or alternatively an adhesive agent such as acrylic resin, epoxy resin and fluorine-containing resin is used to fix the pellicle membrane 2 on the upper annular face. On the other hand, the lower annular face of the pellicle frame 3 is laid with an agglutinant layer 4 made of a polybutene resin, a polyvinyl acetate resin, an acrylic resin and a silicone resin or the like for enabling the pellicle frame 3 to be adhered to the exposure original plate, and on this agglutinant layer 4 is laid a releasable liner for protecting the agglutinant layer 4, if it is required.

The pellicle as described above is installed for the purpose of preventing the dust from adhering to the mask; consequently, it is preferable that the pellicle itself is kept free of dust, and hence it is common that the pellicle is stored in a container 1 specially made for pellicle during preservation or transportation. FIG. 3 shows how a pellicle sits on a mount 6 in a pellicle container made of a resin.

In recent years, however, the design rule for LSI has progressed to require as high a resolution as sub-quarter micron order, and correspondingly as this, shortening of the wavelength of exposure light source is in progress. For this reason, the choice of the exposure light source is shifting from the heretofore commonly used mercury lamp, which emits g-line [436 nm] and i-line [365 nm], to KrF excimer laser [248 nm] and ArF excimer laser [193 nm]) or the like. As the wavelength of the exposure light is shortened, the influence of the deformation of the mask upon the quality of the transferred lithographic image is becoming a greater problem, and therefore the flatness demanded of the mask has been heightening.

One of the factors that affect the flatness of the mask is the flatness of the pellicle which is adhered to the mask, and to address this, IP Publication 1 teaches to make the flatness of the agglutinant layer of the pellicle frame to be 15 micrometers or smaller so as to reduce the deformation of the mask induced by the pellicle as it is adhered to the mask.

However, even though the flatness of the agglutinant layer of the pellicle frame is improved, there are still instances wherein deformation occurs in the lithographic image at the time of exposure by short-wavelength light—hence the problem is not yet solved.
[Prior Art]
[IP Publication]
[IP Publication 1]
Japanese Patent Application Publication 2012-108277

SUMMARY OF THE INVENTION

Problems the Invention Seeks to Solve

The present invention was made in view of this fact and it is therefore an object of the present invention to provide a container for storing a pellicle for lithography which can suppress the deformation of the mask and exposure original plate.

The present inventor made a strenuous effort and came to a thought that a cause for the problem might lie in the flatness of the pellicle mount of the injection-molded pellicle container made of a resin, and he explored the flatness of the pellicle mount of the conventional pellicle containers made of resin, and as a result it was found that there were deformations of which a maximum case measured about 80 micrometers, as shown in FIG. 6. Then, he found that when the pellicle is stored in the pellicle container, and the deformation of the pellicle mount comes in contact with the face of the agglutinant layer of the pellicle, the deformation of the mount affects the flatness of the agglutinant layer, and thus conceived of the present invention.

Means to Solve the Problems

Hence the present invention relates to a container for storing a pellicle used in lithography, comprising a tray and a cover (not shown) between which a pellicle is stored; the tray of the container has a pellicle mount for supporting the pellicle; this container is characteristic in that a plane plate, or preferably a quartz plane plate, having a flatness of 10 micrometers or smaller is provided on top of the pellicle mount. The container of the invention is applicable to various types of pellicle which comprises a pellicle frame, a pellicle membrane attached tensely to an upper annular face of the pellicle frame, and an agglutinant layer laid on a lower annular face of the pellicle frame.

Effects of Invention

According to the present invention, the plane plate having a high flatness such as a quartz plane plate is provided on top of the pellicle mount, usually made of a resin, so that it is possible to suppress the degradation of the flatness of the agglutinant layer of the pellicle caused by the unreliable flatness of the pellicle mount, with a result that it becomes possible to prevent the mask or the like from undergoing a deformation induced by the pellicle whereby micromachining of a pattern with high precision is enabled.

EXAMPLES TO EMBODY THE INVENTION

Now, examples and a comparative example relative to the present invention will be described with reference to the drawings attached, but the present invention shall not be confined to the examples. The present invention is characteristic in that a plane plate, preferably a quartz plane plate 7, having a flatness of 10 micrometers or smaller is introduced, and except for this the construction of the pellicle container of the present invention is similar to that of conventional pellicle containers.

Also, in the examples of the present invention the quartz plane plate 7 is used, and since a plane plate made of quartz is hard and durable and its surface can be easily polished to have a flatness of 10 micrometers or smaller and such flatness of quartz plate can be preserved for a long time, use of a quartz plane plate is most recommended.

EXAMPLES

Example 1

Figure 2:
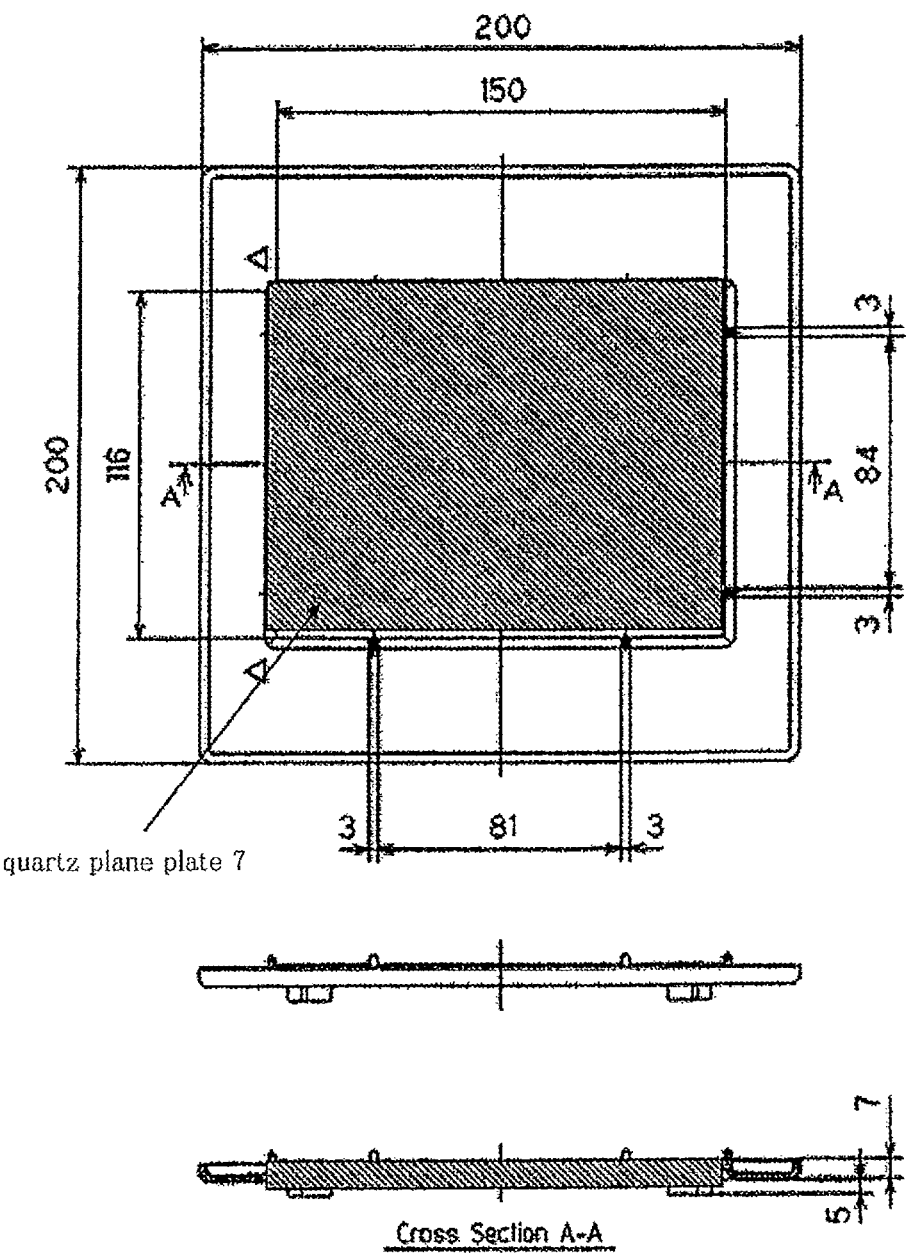
FIG. 2 This includes a plan view and a side view of a tray of a pellicle container of the present invention, and an A-A cross section thereof.

In Example 1, as shown in FIG. 2, a tray of a square pellicle container 1 made of polycarbonate and having an external measure of 200 mm by 200 mm was manufactured by mold injection. Also, a quartz plane plate 7 measuring 150 mm by 116 mm by 6.35 mm (in thickness) was provided on top of a pellicle mount 6, which was in the middle of the tray. The flatness of this quartz plane plate 7 was 7 micrometers.

Figure 1:
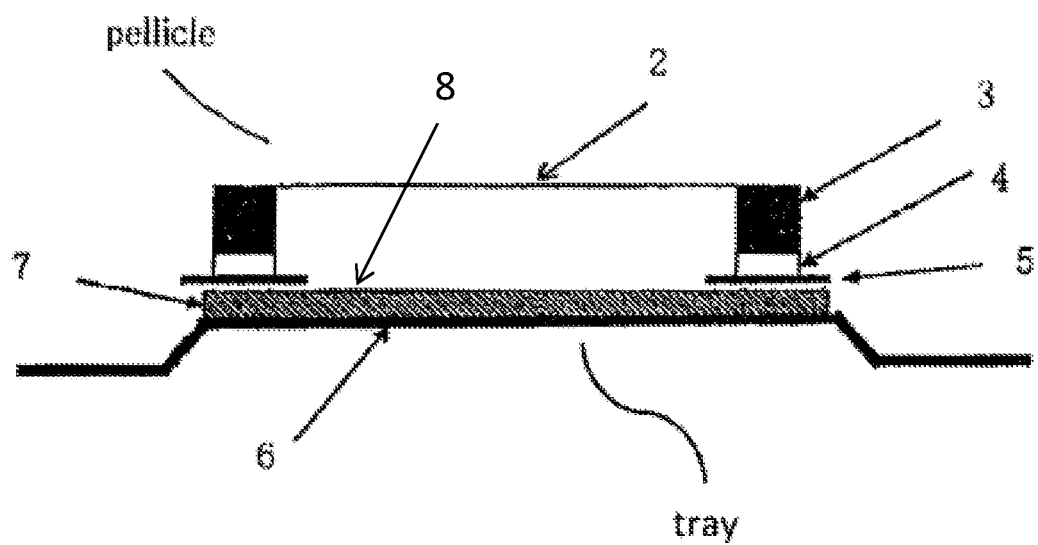
FIG. 1 This is a schematic drawing of an assembly of the present invention including a tray and a pellicle mounted on it.

Next, as shown in FIG. 1, a pellicle was let to sit alone for a predetermined period of time on the surface 8 of the quartz plane plate 7 with the agglutinant layer 4 covered with its protective separator film 5 lying directly on the quartz plane plate 7. Then, the pellicle was removed from this pellicle container 1 and the flatness of the surface of the agglutinant layer 4 was measured and it was found that the value of the flatness had changed by only 10 micrometers during the sitting. Also, this pellicle was adhered to a mask via the agglutinant layer, and the mask was scarcely deformed by the pellicle.

Example 2

Also, in Example 2, similarly as in Example 1, a polycarbonate tray of a pellicle container was used, and on the middle of it was provided a quartz plane plate 7 measuring 150 mm by 116 mm by 6.35 mm (in thickness) and having a flatness of 10 micrometers. Then, a pellicle was let to sit alone for a predetermined period of time on the quartz plane plate 7 with the agglutinant layer 4 covered with the separator film 5 lying directly on the quartz plane plate 7. Then, the pellicle was removed from this pellicle container and the flatness of the surface of the agglutinant layer 4 was measured and it was found that the value of the flatness had changed by only 12 micrometers during the sitting. Also, this pellicle was adhered to a mask via the agglutinant layer, and the mask was scarcely deformed by the pellicle.

COMPARATIVE EXAMPLE

Comparative Example 1

Figure 4:
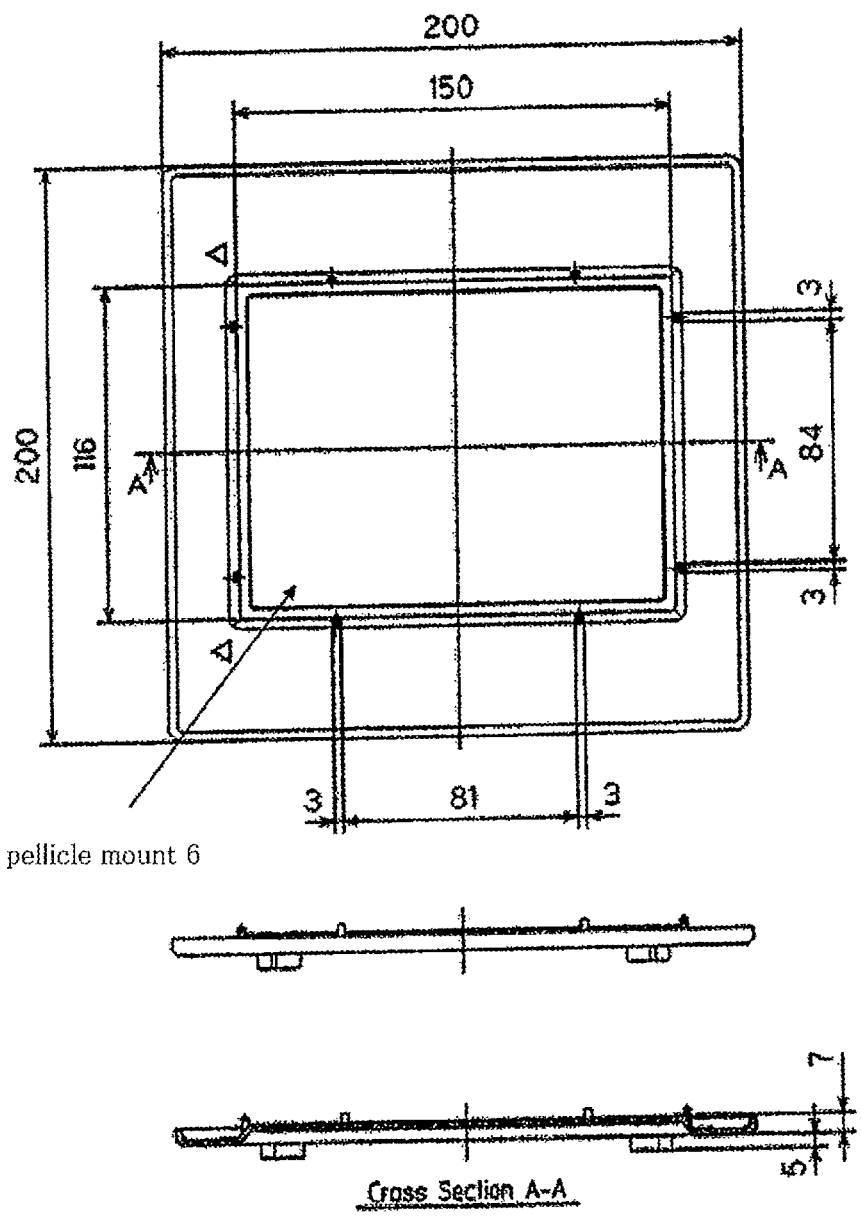
FIG. 4 This includes a plan view and a side view of a tray of a conventional pellicle container, and an A-A cross section thereof.
Figure 5:
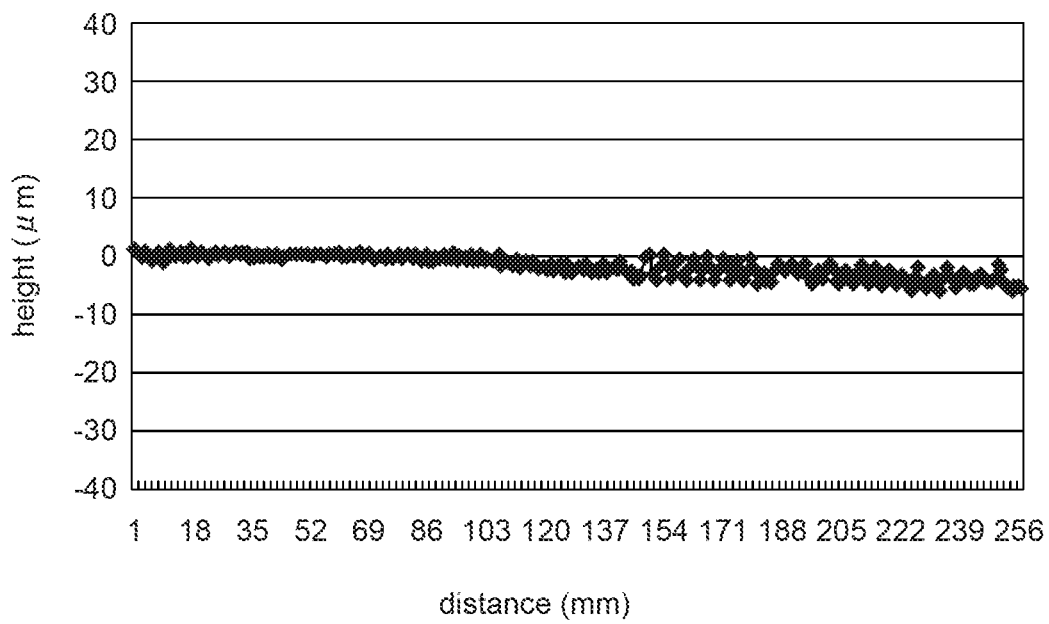
FIG. 5 This is a graph showing ups and downs measured of the pellicle mount of the tray of a pellicle container of the present invention.
Figure 6:
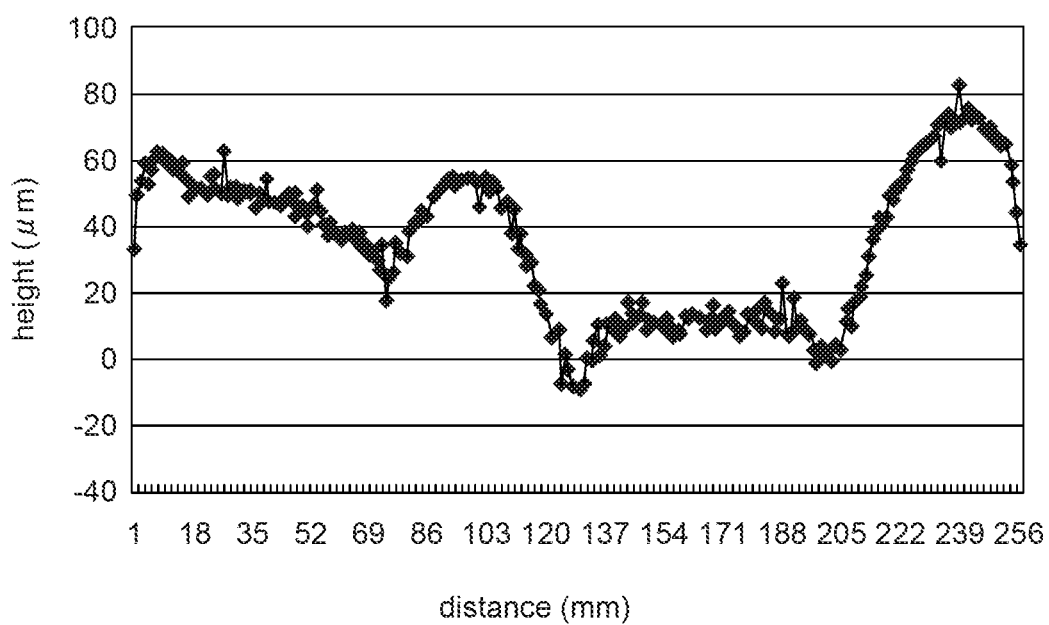
FIG. 6 This is a graph showing ups and downs measured of the pellicle mount of the tray of a conventional pellicle container.

In Comparative Example 1, as shown in FIG. 4, a tray of a square pellicle container 1 made of polycarbonate and having an external measure of 200 mm by 200 mm was manufactured by mold injection. The pellicle mount 6 in the middle of the tray was measured for its flatness, and as is read from the graph of FIG. 6, the maximum height was about 80 micrometers, which means the flatness of the pellicle mount 6 was bad.

Figure 3:
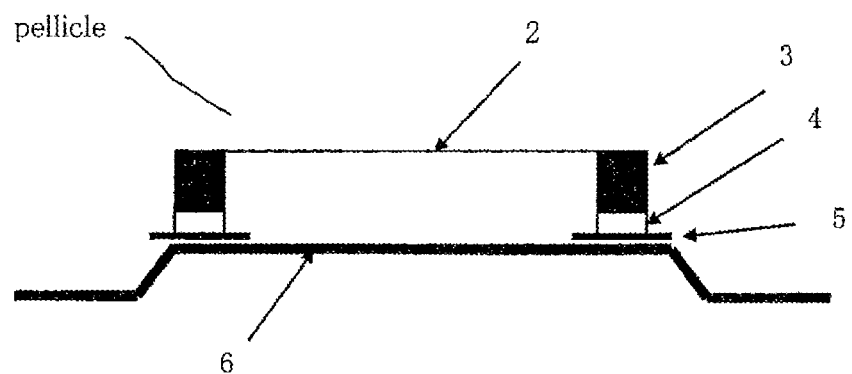
FIG. 3 This is a schematic drawing of a tray of a conventional pellicle container with a pellicle mounted on it.

Next, as shown in FIG. 3, a pellicle was let to sit alone for a predetermined period of time on the pellicle mount 6 with the agglutinant layer 4 covered with its protective separator film 5 lying directly on the pellicle mount 6. Then, the pellicle was removed from this pellicle container 1 and the flatness of the surface of the agglutinant layer 4 was measured and it was found that the value of the flatness had changed by 30 micrometers during the sitting. Also, this pellicle was adhered to a mask via the agglutinant layer, and the mask underwent a substantial deformation induced by the pellicle.

EXPLANATION OF REFERENCE NUMERALS

1: pellicle container
2: pellicle membrane
3: pellicle frame
4: agglutinant layer
5: separator
6: pellicle mount
7: quartz plane plate
8: surface of quartz plane plate

What is claimed is:

1. A pellicle storing apparatus, comprising:
a pellicle comprising:
- a pellicle frame, and
- a transparent pellicle membrane attached to an upper side of the pellicle frame,
- wherein the pellicle frame having an agglutinant layer attached on a lower side of the pellicle frame, the agglutinant layer being covered with a protective separator; and a tray comprising:
- a plate made of quartz, and
- a pellicle mount made of a resin, the pellicle mount having a square surface and the plate made of quartz being placed on the square surface, wherein the agglutinant layer covered with the protective separator is placed directly on a surface of the plate, the surface of the plate having a flatness of 10 micrometers or smaller.

* * * * *